(12) United States Patent
Young et al.

(10) Patent No.: US 6,680,545 B2
(45) Date of Patent: Jan. 20, 2004

(54) SEMICONDUCTOR DEVICES

(75) Inventors: Merlyn P. Young, Hazel Grove (GB); Crispulo E. Lictao, Laguna (PH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/915,677

(22) Filed: Jul. 26, 2001

(65) Prior Publication Data
US 2002/0036355 A1 Mar. 28, 2002

(30) Foreign Application Priority Data

Jul. 31, 2000 (GB) .............................. 0018643

(51) Int. Cl.[7] ................. H01L 23/28; H01L 23/495; H01L 23/48
(52) U.S. Cl. .................... 257/787; 257/666; 257/784
(58) Field of Search ............... 257/787, 666, 257/784

(56) References Cited

U.S. PATENT DOCUMENTS

| | | | |
|---|---|---|---|
| 4,768,081 A | 8/1988 | Moeller | 357/72 |
| 5,847,445 A * | 12/1998 | Wark et al. | 257/666 |
| 6,194,251 B1 * | 2/2001 | Ahmad | 257/687 |
| 2001/0015490 A1 * | 8/2001 | Lee | 257/693 |
| 2002/0000671 A1 * | 1/2002 | Zuniga et al. | 257/773 |

FOREIGN PATENT DOCUMENTS

JP 60150657 A 8/1985

OTHER PUBLICATIONS

"Partial Resolution in Branch Target Buffers", by B. Fagin et al., Proceedings of MICRO–28., pp. 193–198.

* cited by examiner

Primary Examiner—Amir Zarabian
Assistant Examiner—Kiesha Rose
(74) Attorney, Agent, or Firm—Steven R. Biren

(57) ABSTRACT

In plastics-encapsulated semiconductor devices, for example surface-mount power devices, aluminium corrosion due to ingress or generation of moisture within the encapsulation (150) is avoided by bonding at least one sacrificial additional wire (24, 25, 26, 27) of substantially pure aluminium to a bond pad (11, 13, 14) and/or terminal area (101, 110) of the device. The actual connection wires (21, 22, 23) of the device are of an alloyed aluminium material, such as nickel-doped aluminium, that is more resistant to corrosion by moisture than is the sacrificial additional wire (24, 25, 27). The sacrificial additional wire (24, 25, 27) serves as a corrodible getter of the moisture within the encapsulation (150). The bond pads (11, 12, 13, 14) may be of an aluminium alloy, for example an aluminium-silicon alloy, or even of relatively pure aluminium.

12 Claims, 1 Drawing Sheet

SEMICONDUCTOR DEVICES

This invention relates to plastics-encapsulated semiconductor devices, for example power devices, device assemblies and integrated circuits, particularly (but not exclusively) of the surface-mount device (so-called SMD) type. It is concerned with aluminium corrosion in such devices due to moisture.

In semiconductor device manufacture, it is a common technique to use plastics material (synthetic resins) to encapsulate a semiconductor device body. Typically, for power devices, the device body has bond pads of aluminium at a surface thereof. Connection wires are bonded between these bond pads and electrical terminal areas of the device. It is convenient to make the connection wires also of aluminium, having regard to metallurgical compatibility, current-carrying capability and cost. Both the device body and connection wires are located inside the plastics encapsulation, and they are thereby protected from the environment around the device.

However, it is found that plastics-encapsulated semiconductor devices can fail when moisture ingresses into and/or is generated within the plastics material. This can occur when the device becomes hot during, for example, surface mounting on a circuit board and/or during operation of the device. Its occurrence can be investigated by the device manufacturer in a reliability test, when the manufactured devices are pre-conditioned in conditions of humidity and heat. It is found that the moisture can attack and corrode the aluminium bond pads and the aluminium connection wires. Severe inter-granular corrosion of the aluminium material can occur, leading to an increase in electrical resistance and even to ultimate failure in electrical contact.

It is known to form connection wires of gold, instead of aluminium. Gold itself is resistant to corrosion by moisture, so ensuring the integrity of the connection wires themselves. However, the use of gold wire is much more expensive than aluminium wire, and it is not as compatible with an aluminium bond pad. Thus, particularly in power devices and/or at high temperature operation, intermetallic Au-Al compounds can be formed that are mechanically brittle and electrically resistive. Furthermore, in the presence of moisture, the two metals gold and aluminium can act as a galvanic battery, encouraging significant electrolytic corrosion of the aluminium.

U.S. Pat. No. 4,768,081 describes devices having connection wires of gold, wherein some form of getter is provided to capture the moisture. The preferred getter in U.S. Pat. No. 4,768,081 is a barium-aluminium alloy (such as $BaAl_4$) that is dispersed as a fine-grained powder in a gas-permeable inert silicone rubber within the encapsulation. The whole contents of U.S. Pat. No. 4,768,081 are hereby incorporated herein as reference material.

In order to reduce the electrolytic corrosion of aluminium bond pads in devices with gold connection wires, Japanese patent application kokai JP-A-60-150657 and its English-language abstract in the Patent Abstracts of Japan (Vol.9 No.318) proposes screening the (small-gauge) gold wire with an evaporated aluminium coating. The aluminium coating provides a sacrificial material that dissolves in the moisture as aluminium ions, so that any such moisture that reaches the aluminium bond pad is already saturated with aluminium and so should not corrode the bond pad. However, where the gold wire is ball-bonded to the aluminium pad, the gold ball is not protected by the aluminium coating and is exposed to the moisture. Thus, the possibility of galvanic action remains. Furthermore, the process is expensive, not only in using gold wire, but also in coating it with aluminium, and the coating will be alloyed and destroyed in the area of ball bond formation. Difficulty is also foreseen in adapting the wire-bonding equipment to handle the aluminium-coated small-gauge gold wire, without damage of the aluminium coating. The whole contents of JP-A-60-150657 and its English-language abstract are hereby incorporated herein as reference material.

Corrosion-resistant aluminium wire is commercially available, for example, under the trade name Tanaka. Such wire is of aluminium doped (i.e. at a parts per million level) with another element such as nickel that is effective in preventing intergranular corrosion of the aluminium by moisture. The use of such a corrosion-resistant aluminium alloy (instead of pure aluminium) avoids the incompatibility problems of gold wire. However corrosion by moisture is still found to occur at, for example, the bond pads.

It is an aim of the present invention to combat moisture corrosion in a plastics-encapsulated semiconductor device that has an aluminium-based metallurgy for its connection wires and bond pads.

According to the present invention, there is provided a plastics-encapsulated semiconductor device having a sacrificial, additional wire of substantially pure aluminium that is less resistant to corrosion by moisture within the encapsulation than are aluminium-alloy connection wires.

Devices in accordance with the present invention may have the features set out in claim 1.

A corrosion-resistant aluminium material, such as nickel-doped aluminium, is used for the connection wires, whereas the sacrificial additional wire is of relatively pure aluminium material that serves as a corrodible getter of the moisture within the encapsulation. This moisture getter of sacrificial aluminium wire protects the bond pads, which may be of an aluminium alloy or of relatively pure aluminium, from severe moisture corrosion. Thus, the present invention provides a low-cost aluminium-based compatible metallurgical scheme for the bond pads and wires. The connection wires and sacrificial additional wire can be bonded using the same equipment.

The sacrificial additional wire may take a variety of forms, for example, as a parallel connection, or as a so-called 'stitch-bond', a wire loop, or a bonded ball stump.

More than one such sacrificial additional wire in accordance with the invention may be provided within the encapsulation, for example at different locations within the encapsulation as and where space permits.

A sacrificial additional wire in accordance with the invention may be bonded in parallel with a connection wire, between the same bond pad and the same electrical terminal area as the connection wire. Where insufficient space is available on and between the bond pads and/or terminal areas, a sacrificial additional wire in accordance with the invention may be severed near its bond to form a stump, or it may be bonded in an electrically isolated loop.

Particularly in a power device, the bond pad of a main current path through the device body may have more than sufficient space available for the additional bonding thereto of one or more such sacrificial additional wires in accordance with the invention.

Where there is sufficient space available, the sacrificial additional wire may be bonded on an electrically conductive mount which carries the device body or on a further bond pad (even, for example, an electrically inactive bond pad) that may be provided on the device body. However, preference should be given to bonding the sacrificial wire to active bond pads of the device body, in order to maximize the protection for these bond pads.

Embodiments of the present invention are now described, by way of example, with reference to the accompanying diagrammatic drawings, in which.

Figure 1:
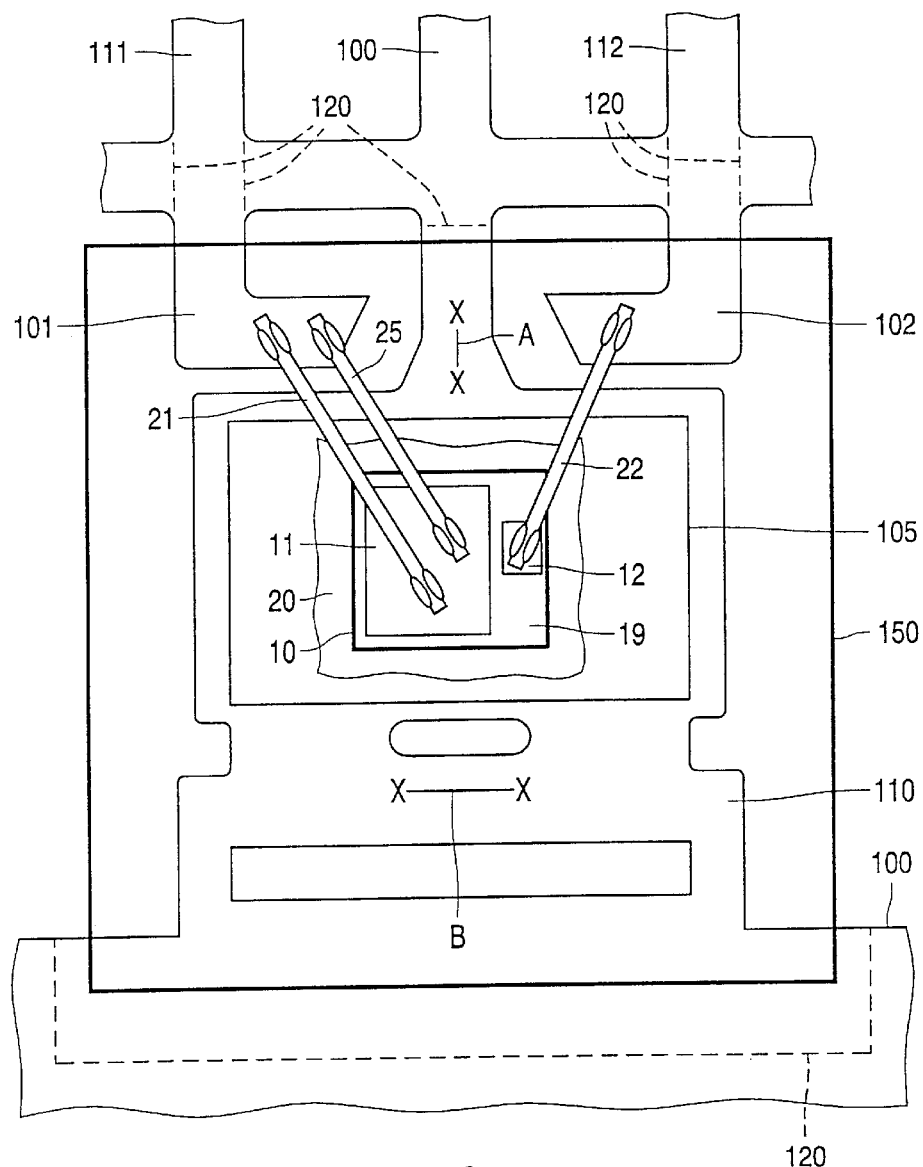
FIG. 1 is a plan view of part of one example of a plastics-encapsulated semiconductor power device in accordance with the invention.

Both Figures are diagrammatic. Dimensions and proportions of parts of the drawings have been shown exaggerated or reduced in size, for the sake of clarity and convenience in the drawings. Although, the FIG. 2 section is through the solid plastics material that encapsulates the device bodies and their connections, this encapsulation is not hatched in FIG. 2 for the sake of clarity in the drawing. The same reference signs are generally used to refer to corresponding or similar features in modified and different embodiments.

The semiconductor device of FIG. 1 is a discrete device, for example a power transistor, comprising a single semiconductor body 10 within its plastics encapsulation 150. The semiconductor device of FIG. 2 is a power device module comprising an assembly of two semiconductor bodies 10 and 10' within its plastics encapsulation 150.

Figure 2:
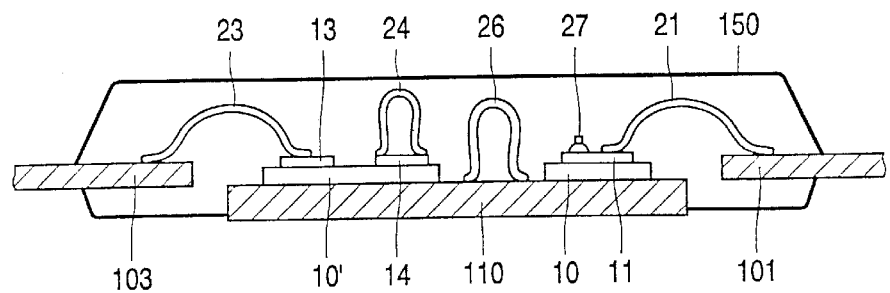
FIG. 2 is a part cross-sectional, part side view of another example of a plastics-encapsulated semiconductor power device, illustrating several other locations where a sacrificial additional wire in accordance with the invention may be bonded.

In broad overview of FIGS. 1 and 2, the semiconductor device bodies 10, 10' comprise bond pads 11, 12, 13, 14 of aluminium (or an aluminium alloy) at an upper surface thereof. Connection wires 21, 22, 24 are bonded between the bond pads 11, 12, 14 and respective electrical terminal areas 101, 102, 104 of the device. Typically these terminal areas 101, 102, 104 are lead ends of an electrically conductive lead-frame 100. The leads may be bent on the outside of the encapsulation 150 in a standard SMD package outline.

In accordance with the present invention at least one additional wire, a sacrificial wire, is bonded to a bond pad and/or terminal area in an area of potential moisture ingress or moisture generation within the encapsulation 150. By way of example, FIG. 1 shows one such sacrificial additional wire 25, in one advantageous location in accordance with the invention, whereas FIG. 2 shows three such sacrificial additional wires 24, 26, 27 in different locations also in accordance with the invention. The device bodies 10, 10' and their wires 21 to 27 are all located inside the respective plastics encapsulation 150.

Furthermore in broad overview in accordance with the invention, the connection wires 21 to 23 are of a doped aluminium material that is more resistant to corrosion by moisture than is the sacrificial additional wire 24 to 27. The sacrificial additional wire 24 to 27 is of substantially pure aluminium material, and it serves as a corrodible getter of the moisture within the encapsulation 150. The bond pads 11 to 14 may be of an aluminium alloy, for example an aluminium-silicon alloy, or they may even be of relatively pure aluminium.

In a typical embodiment, the sacrificial wires 24 to 27 are of commonly-available commercially-pure aluminium wire with a specified aluminium purity of at least 99.99%, i.e. with less than 0.01% of impurities. In practice, the aluminium purity level of this commercially-available wire is higher than 99.99%.

Also commercially available is corrosion-resistant wire of aluminium alloyed with one or more other elements. One such example is nickel-doped aluminium wire that is available under the trade name TANW (Tanaka Aluminium New Wire, or Tanaka Aluminium Nickel Wire) from Tanaka Denshi Kogyo K. K. of Tokyo. This aluminium wire contains a ppm (parts per million) level of nickel that is sufficient to render the wire resistant to inter-granular corrosion of the aluminium by moisture. Typically, the nickel content of TANW is 50±10 ppm by weight, i.e. the wire material with less than 0.1% impurities is at least 99.985% Al with about 0.005% Ni. More generally, an aluminium wire may be provided in this manner with corrosion resistance by being formed of aluminium doped with a nickel content of up to about 200 ppm by weight. As regards its physical handling and bonding properties, for example, such an aluminium-nickel alloy (Al:Ni) wire is entirely compatible with those of commercially pure aluminium wire. Thus, it is a particularly advantageous to use such an aluminium nickel alloy as the corrosion-resistant material for the connection wires 21 to 23.

So as to reduce the uptake of silicon from the device body 10, 10' which is typically of monocrystalline silicon, it is generally advantageous to form the bond pads 11 to 14 of an alloy of aluminium with silicon. Typically the aluminium alloy may comprise about 1% of silicon by weight. This silicon content of the pads 11 to 14 also increases their resistance to corrosion by moisture, but not as effectively as a very much lower doping level (ppm) of nickel. Other elements such as copper and/or titanium and/or magnesium may also be added to the aluminium-silicon alloy, for example to reduce electro-migration of the aluminium.

The inclusion of these other elements also increases the resistance of aluminium to corrosion by moisture, but not as effectively as nickel. It is therefore preferable for the connection wires 21 to 23 to be nickel doped. However, alloys of Al with one or more of Si, Cu, Ti and Mg could be used for the connection wires 21 to 23. Thus, for example, when using 99% Al with 1% Si for the bond pads and the connection wires, it is found that the inclusion of a sacrificial extra wire of commercially pure Al (at least 99.99% Al) results in the intergranular corrosion switching to the sacrificial wire.

As well as possibly these other elements, the bonding pads 11 to 13 may contain a nickel doping and so could be made very resistant to corrosion. However, this complicates the standard manufacturing processes and is found to be unnecessary. The provision of a sacrificial wire 24 to 27 of substantially pure aluminium in accordance with the invention can be so effective in preventing moisture corrosion that the pads 11 to 13 may even be of commercially-available standard aluminium, i.e. relatively pure aluminium.

The widths (diameters) of the connection wires 21 to 23 are chosen in accordance with their current carrying requirements. Thus, one or more quite thick wires are required for a main current path of a power device. The sacrificial wire 24 to 27 can be thinner. The surface area of the wire (and hence the moisture gettering area) per unit mass of aluminium is larger as the width of the wire is smaller. However, a lower limit on the width of the sacrificial wire is determined by a practical maximum length of bonded wire that can be included in the device and by the extent of intergranular corrosion and disintegration of the wire during the lifetime of the device. Generally, about 50 micrometers is a practical lower limit for the width (diameter) of the sacrificial wire, and preferably a wider wire is used, for example more than 75 micrometers or even up to about 200 micrometers.

In a typical example of the FIG. 1 embodiment, the device body 10 of monocrystalline silicon may comprise a power MOSFET or a power bipolar transistor. In each case, a main current path extends through the device body 10, between main electrodes (source and drain, or emitter and collector) at respective opposite main surfaces of the body.

One or more insulating and passivating layers 19 are present in the conventional manner at the top surface of the body 10. The main bond pad 11 at the top surface is typically that of the source or emitter electrode. Another, smaller bond pad 12 (of the same aluminium material as the pad 11) is also present at the top surface and provides the connection area for the control (gate or base) electrode of the transistor.

The opposite main electrode (drain or collector) at the bottom surface is connected directly to the electrically conductive mount 110 on which the body is carried. Typically, this direct connection may be achieved by solder 20 on a pedestal portion 105 of the mount 110. The mount 110 may be part of the lead-frame 100.

FIG. 1 shows the device lead frame 100 before it is severed along lines 120 to form the separate terminal connections, namely the source or emitter lead 111, the gate or base lead 112, and the drain or collector terminal that is provided by the mount 110. The plastics encapsulation 150 is indicated only in outline in FIG. 1.

In a specific example of a power MOSFET embodiment in accordance with the invention, Tanaka TANW-300 was used to form an Al:Ni wire 21 of 300 micrometer diameter for the source connection to the main bond pad 11. A thinner Tanaka wire (TANW-125) was used to form an Al:Ni wire 22 of 125 micrometer diameter for the gate connection to the bond pad 12. A single wire 25 of commercially pure (at least 99.99%) pure aluminium with a diameter of 150 micrometer was used for the sacrificial getter. This device (designated Embodiment) was compared with a control device (designated Control), that had Tanaka TANW-300 wire 21 of 300 micrometer diameter for its source connection and Tanaka TANW-125 wire 22 of 125 micrometer diameter for its gate connection. The Control device had no sacrificial getter wire. Both the Embodiment and the Control had bond pads 11 and 12 of 1% Si: 99% Al. Samples of both the Embodiment and Control were subjected to a reliability test for 96 hours at 121° C. in 100% relative humidity. The results in terms of Rdson (ON resistance between the source and drain terminals 111 and 110) are summarised in the following table:

|  | Average initial Rdson In mOhm | average final Rdson in mOhm | max % shift |
|---|---|---|---|
| control | 13.81 | 13.95 | 3.23 |
| embodiment | 13.25 | 13.56 | 3.68 |

The lower initial Rdson of the Embodiment (as compared with the Control) is a consequence of the extra parallel connection provided by the additional wire 25. The final Rdson was measured after the test, and then the plastics material 150 was stripped from the devices to permit inspection of their wires and bond pads.

There were no signs of the Al:Ni wires being corroded by moisture, in either the Embodiment or the Control. The Al:Si source and gate pads 11 and 12 of the Control showed signs of intergranular corrosion by moisture, for example around the bond area, and this is reckoned to be the cause of the change in Rdson in the Control. In the Embodiment, intergranular corrosion of the sacrificial getter wire 25 of the 99.99% pure Al was clearly seen, but there were no signs of such corrosion in the Al:Si bond pads 11 and 12. Although the resulting change in Rdson of the Embodiment was more than that in the Control, the final Rdson of the Embodiment was still significantly lower than the initial Rdson of the Control.

The maximum percentage change in both the Embodiment and the Control was around 3%. This compares very favorably with devices in which all the wires are of commercially pure (at least 99.99%) Al, where average percentage changes of 10% are seen, and maximum percentage changes in excess of 20% are not uncommon.

In the FIG. 1 embodiment, the sacrificial Al getter wire 25 is bonded to the large bond pad 11 of a main current path through the device body 10. This is an optimum location. Also in this example, the sacrificial wire 25 is bonded in parallel with the wider connection wire 21, between the same bond pad 11 and same electrical terminal area 101 as the connection wire 21. This provides a good length for the sacrificial wire 25, as well as reducing the resistance of the connection by providing a parallel path.

The device of FIG. 1 is illustrated with only one sacrificial Al wire 25. However, more such wires may be provided in accordance with the invention, in various locations inside the encapsulation 150. Three such possibilities are illustrated in FIG. 2. Thus, the device of FIG. 2 includes three further getter wires of substantially pure Al, namely the wires 24, 26 and 27. Thus, these sacrificial wires 24, 26, 27 may also be of the commercially pure (at least 99.99% pure) Al.

The wires 24 and 26 in FIG. 2 are each bonded in an electrically isolated loop, by being bonded back onto a common conductive part of the device. The loop 26 is bonded to the electrically conductive mount 110 on which the device bodies 10 and 10' are mounted. With the leadframe 100 of FIG. 1, there is sufficient space available for the bonding of similar loops 26 of sacrificial Al getter wire at the locations A and B in FIG. 1. The sacrificial Al wire loop 24 of FIG. 2 is bonded to a bond pad 14, which may be an electrically active or inactive bond pad 14 at the top surface of the device body 10'. By relocating the bond pad 12 towards a corner of the body 10 in FIG. 1, a space may be created on the body 10 in FIG. 1 for an (inactive) pad 14 with a sacrificial Al wire loop 24 beside the bond pad 12.

The sacrificial Al wire 27 in FIG. 2 is ball-bonded to the bond pad 11 and is severed in the vicinity of the ball to form a wire stump. Such a ball stump 27 may be provided on the main electrode pad 11 in FIG. 1. Similar free-standing wire stumps 27 may be bonded to a terminal area or to the mount 110 in FIG. 1 or in FIG. 2.

From reading the present disclosure, other variations and modifications will be apparent to persons skilled in the art. Such variations and modifications may involve equivalent and other features which are already known in the art and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A plastics-encapsulated semiconductor device comprising a semiconductor device body that has bond pads of aluminium at a surface of the device body, and connection wires of aluminium that are bonded between the bond pads and electrical terminal areas of the device, the device body and connection wires being located inside a plastics encapsulation, wherein a sacrificial additional wire is bonded to a bond pad and/or terminal area in a potential moisture area within the encapsulation, the connection wires are of aluminium alloyed with another element that renders the connection wires more resistant to corrosion by moisture than is the sacrificial additional wire, and the sacrificial additional wire is of a purer aluminium material that serves as a corrodible getter of the moisture within the encapsulation.

2. A device as claimed in claim 1, wherein the sacrificial additional wire is bonded to a bond pad of a main current path through the device body.

3. A device as claimed in claim 1, wherein the sacrificial additional wire is bonded in parallel with a connection wire, between the same bond pad and same electrical terminal area as the connection wire.

4. A device as claimed in claim 3, wherein the sacrificial additional wire has a smaller width than the parallel connection wire.

5. A device as claimed in claim 1, wherein the sacrificial additional wire is bonded in a loop on a common bond pad and/or terminal area.

6. A device as claimed in claim 5, wherein the sacrificial additional wire is bonded in a loop to an electrically conductive mount on which the device body is mounted.

7. A device as claimed in claim 1, wherein the sacrificial additional wire is ball-bonded to the bond pad and/or terminal area and is severed in the vicinity of the ball bond to form a ball stump.

8. A device as claimed in claim 1, wherein the sacrificial additional wire is at least 99.99% pure aluminium.

9. A device as claimed in claim 1, wherein the sacrificial additional wire has a width of more than 75 micrometers.

10. A device as claimed in claim 1, wherein the connection wires are of aluminium doped with nickel.

11. A device as claimed in claim 1, wherein the bond pads are of an aluminium alloy.

12. A plastics-encapsulated semiconductor device, comprising:

a semiconductor body having a surface;

a plurality of aluminum bond pads positioned on the surface;

aluminum connection wires bonded between the bond pads and electrical terminal areas of the semiconductor device, wherein the semiconductor body and the connection wires are positioned within a plastic encapsulation; and a sacrificial additional wire bonded to at least one of a bond pad or a terminal area in a potential moisture area within the encapsulation, wherein the connection wires are of aluminum alloyed with another element that renders the connection wires more resistant to corrosion by moisture than the sacrificial additional wire, and wherein the sacrificial additional wire is of a purer aluminum material than the connection wires and serves as a corrodible getter of moisture within the encapsulation.

* * * * *